(12) United States Patent
Guo et al.

(10) Patent No.: US 8,105,863 B2
(45) Date of Patent: Jan. 31, 2012

(54) METHOD FOR ETCHING A SEE-THROUGH THIN FILM SOLAR MODULE

(75) Inventors: Peng Guo, Shanghai (CN); Xianzhong Song, Shanghai (CN); Qi Qiao, Shanghai (CN); Yongqian Wang, Shanghai (CN)

(73) Assignees: Wuxi Suntech Power Co., Ltd., Jiangsu (CN); Suntech Power Co., Ltd., Shanghai (CN)

( * ) Notice: Subject to any disclaimer, the term of this patent is extended or adjusted under 35 U.S.C. 154(b) by 0 days.

(21) Appl. No.: 12/805,052

(22) Filed: Jul. 8, 2010

(65) Prior Publication Data
US 2011/0008928 A1    Jan. 13, 2011

(30) Foreign Application Priority Data
Jul. 13, 2009    (CN) .......................... 2009 1 0158977

(51) Int. Cl.
*H01L 21/00*    (2006.01)
(52) U.S. Cl. .......................................... 438/73; 438/96
(58) Field of Classification Search .................... 438/73, 438/96
See application file for complete search history.

(56) References Cited

U.S. PATENT DOCUMENTS

| | | | | |
|---|---|---|---|---|
| 4,758,526 A * | 7/1988 | Thalheimer | ...................... | 438/80 |
| 4,795,500 A * | 1/1989 | Kishi et al. | ...................... | 136/244 |
| 5,726,065 A * | 3/1998 | Szlufcik et al. | ................. | 438/57 |
| 5,956,572 A * | 9/1999 | Kidoguchi et al. | ............. | 438/96 |
| RE37,512 E * | 1/2002 | Szlufcik et al. | ................. | 438/57 |
| 7,364,938 B2 * | 4/2008 | Ribeyron et al. | ................ | 438/98 |
| 7,824,563 B2 * | 11/2010 | Stockum et al. | ................ | 216/83 |
| 7,888,167 B2 * | 2/2011 | Yamazaki et al. | ............... | 438/96 |
| 7,951,637 B2 * | 5/2011 | Weidman et al. | ............... | 438/57 |
| 2004/0063326 A1 * | 4/2004 | Szlufcik et al. | ............... | 438/695 |
| 2008/0121621 A1 * | 5/2008 | Stockum et al. | ................ | 216/97 |
| 2008/0210660 A1 * | 9/2008 | Stockum et al. | ................ | 216/13 |
| 2008/0217576 A1 * | 9/2008 | Stockum et al. | ............. | 252/79.2 |
| 2008/0230121 A1 * | 9/2008 | Terakawa | ....................... | 136/261 |
| 2009/0111206 A1 * | 4/2009 | Luch | ............................. | 438/59 |
| 2009/0159121 A1 * | 6/2009 | Yang et al. | .................... | 136/256 |
| 2009/0227063 A1 * | 9/2009 | Ravi et al. | ...................... | 438/73 |
| 2009/0277504 A1 * | 11/2009 | Yamazaki | ...................... | 136/258 |
| 2010/0015756 A1 * | 1/2010 | Weidman et al. | .............. | 438/96 |
| 2010/0037933 A1 * | 2/2010 | Hovel et al. | ................... | 136/246 |
| 2010/0068889 A1 * | 3/2010 | Stockum et al. | ............. | 438/745 |
| 2010/0068890 A1 * | 3/2010 | Stockum et al. | ............. | 438/754 |
| 2010/0108134 A1 * | 5/2010 | Ravi | ............................. | 136/256 |
| 2010/0193016 A1 * | 8/2010 | Fernandez et al. | ............ | 136/255 |
| 2010/0300507 A1 * | 12/2010 | Heng et al. | .................... | 136/244 |
| 2011/0126876 A1 * | 6/2011 | Guo et al. | ..................... | 136/244 |

FOREIGN PATENT DOCUMENTS

WO    WO 2011/018602    *    2/2011

* cited by examiner

*Primary Examiner* — N Drew Richards
*Assistant Examiner* — Grant Withers
(74) *Attorney, Agent, or Firm* — Nixon & Vanderhye P.C.

(57) ABSTRACT

This invention discloses a method for etching a see-through thin film solar module, comprising: printing ink paste which resists the etching of etching solutions in the protected area of the thin film solar module which is placed under a screen; drying and solidifying the ink paste; coating etching solutions on the thin film solar module; and removing the ink paste. The method of this invention can accurately position the see-through area, achieve various selections of see-through patterns, facilitate the realization of the see-through function in large-area thin film solar modules, and alleviate the problem that a short circuit easily occurs in a see-through thin film solar module.

10 Claims, 4 Drawing Sheets

METHOD FOR ETCHING A SEE-THROUGH THIN FILM SOLAR MODULE

This application claims priority to CN Patent Application No. 200910158977.5 filed 13 Jul. 2009, the entire contents of which is hereby incorporated by reference.

TECHNICAL FIELD

This invention relates to the photovoltaic field, particularly to a method for etching a thin film solar module.

BACKGROUND OF THE INVENTION

In recent years, to develop alternative energy, photovoltaic technology has made great progress. Due to the beautiful appearance of a thin film solar module, integration of a thin film solar module and architecture has an increasingly wide application prospect. When a thin film solar module is used as an architectural curtain wall, the see-through of the thin film solar module is getting closer attention while focusing on its power output performance. Currently, the function of see-through of a thin film solar module is usually realized by chemical etching and laser patterning. An adhesive tape is used as the mask in chemical etching in the prior arts. Specifically, after depositing the amorphous silicon film, an adhesive tape is stuck to the parts that need etching; then a non-oxidized metal that can resist NaOH etching is deposited on the surface of the amorphous silicon film; finally, the etching is performed with NaOH solution to realize see-through after the adhesive tape is removed.

However, the above technical solutions at least have the following problems:

Placing an adhesive tape in a vacuum chamber will cause contamination, greatly affects the quality of the as-deposited films and increases the possibility of short circuit of the see-through thin film solar module;

In the circumstance of hot alkali solution, the alkali solution will penetrate into the part covered by the adhesive tape; as a result, the protected area and the etched area cannot be accurately defined, or even the electrical performance of the whole see-through thin film solar module will be greatly lowered;

Sticking and removing the adhesive tape are not practical for manufacturing efficient large-area modules in a large scale.

If laser patterning is used, since the current laser equipments usually use circular light spots, the laser energy is not evenly distributed in the middle portion and the periphery of the light spot; then the scribed thickness will be uneven; the undesirable periphery effect will affect the electrical performance of the thin film solar module.

SUMMARY OF THE INVENTION

The objective of this invention is to solve the above problems brought by traditional processes when realizing see-through of a thin film solar module. This invention provides a new etching method, without using an adhesive tape as the mask, which can accurately position the see-through area, achieve various selections of see-through patterns, facilitate the realization of see-through function in large-area thin film solar modules, and alleviate the problem that a short circuit easily occurs in a see-through thin film solar module.

Therefore, this invention provides a method for etching a see-through thin film solar module, comprising:

screen-printing ink paste which resists the etching of etching solutions in the protected area of the thin film solar module which is placed under a screen, and drying and solidifying the ink paste;

coating etching solutions on the thin film solar module; and removing the ink paste.

Preferably, the screen is pre-set with a pattern corresponding to the area that needs to be see-through of the thin film solar module.

Preferably, the ink paste is a water soluable ink paste.

Preferably, the water soluable ink paste comprises: 25%-35% of water soluable acrylic resin, 15%-25% of water, 5%-15% of ethanol, 5%-10% of triethylamine, 10%-30% of pigment and 1%-3% of additive.

Preferably, the removal of the ink paste is performed by flushing the ink paste with deionized water.

Preferably, coating the etching solutions on the thin film solar module comprises:

coating the thin film solar module with HCL solution having a concentration of 10%-30% which reacts with the metal electrode on the back of the thin film solar module to etch the metal electrode; and coating the thin film solar module with NaOH solution having a concentration of 10%-30% and a temperature of 40° C.-80° C. which reacts with the bared amorphous silicon film of the thin film solar module to remove the amorphous silicon film.

Preferably, the method further comprises cleaning the thin film solar module etched by the HCL solution before coating the NaOH solution.

Preferably, the concentration of the HCL solution is 15%-25%.

Preferably, the NaOH solution has a concentration of 15%-25% and a temperature of 50° C.-70° C.

Preferably, coating the etching solutions on the thin film solar module refers to immersing the thin film solar module in the etching solutions or spraying the etching solutions on the thin film solar module.

The advantageous effects of the method for etching a see-through thin film solar module of this invention are:

providing a new method for etching a see-through thin film solar module, without using an adhesive tape as the mask, accurately positioning the see-through area, achieving various selections of see-through patterns, facilitating the realization of the see-through function in large-area thin film solar modules, and alleviating the problem that a short circuit easily occurs in a see-through thin film solar module.

DESCRIPTIONS OF THE DRAWINGS

EMBODIMENTS

The followings clearly and completely describe the technical solutions in the embodiments of this invention with reference to the figures in the embodiments. Obviously, the embodiments described here are only a portion of the embodiments of this invention rather than all the embodiments. Based on the embodiments of this invention, the person skilled in the art can acquire other embodiments without any creative work, which fall into the protection scope of this invention.

Figure 1:
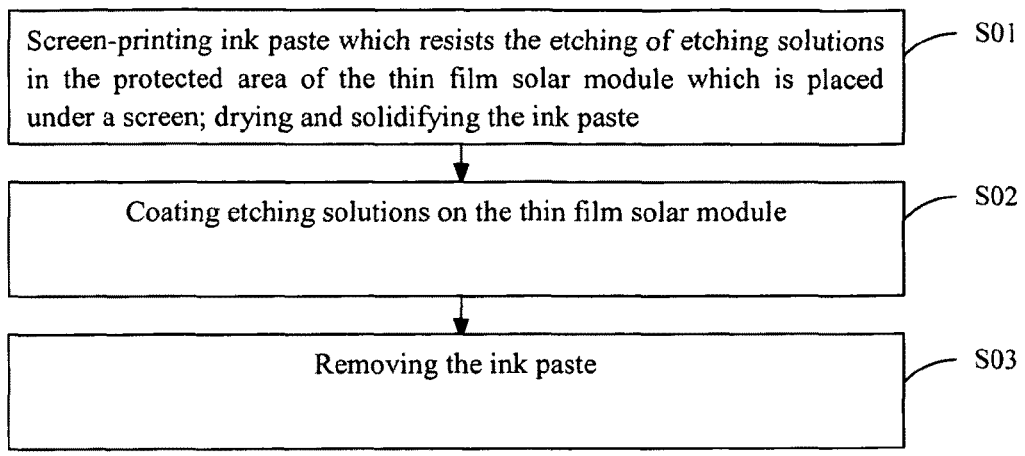
FIG. 1 is the flowchart of one embodiment of the method for etching a see-through thin film solar module of this invention.

FIG. 1 is the flowchart of one embodiment of the method for etching a see-through thin film solar module of this invention.

As shown in FIG. 1, the method for etching a see-through thin film solar module comprises:

S01: screen-printing ink paste which resists the etching of etching solutions in the protected area of the thin film solar module which is placed under a screen, and drying and solidifying the ink paste;

S02: coating etching solutions on the thin film solar module; and

S03: removing the ink paste.

In this embodiment, first, a screen printing process is used to print ink paste which resists the etching of etching solutions in the protected area, i.e. the area that does not need to be see-through, of the thin film solar module which is placed under a screen; the screen is removed; the ink paste is dried and solidified; the etching solutions are coated on the thin film solar module; the back metal electrode layer and the amorphous silicon thin film layer are etched away to reveal the transparent conductive film, thereby realizing see-through; finally, the ink paste is removed.

Figure 2:
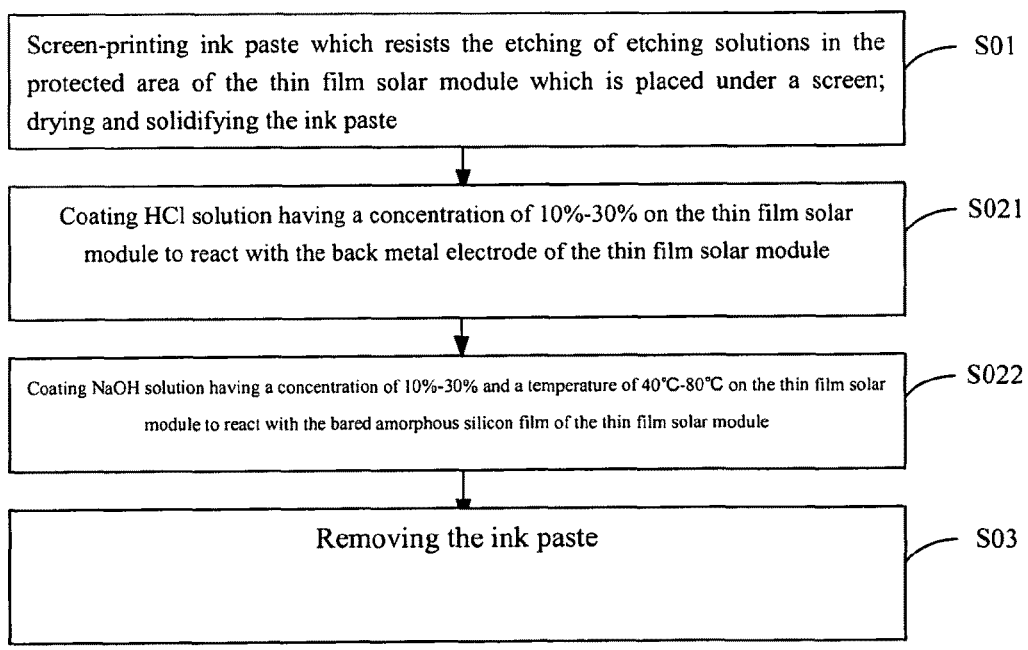
FIG. 2 is the flowchart of another embodiment of the method for etching a see-through thin film solar module of this invention.
Figure 3:
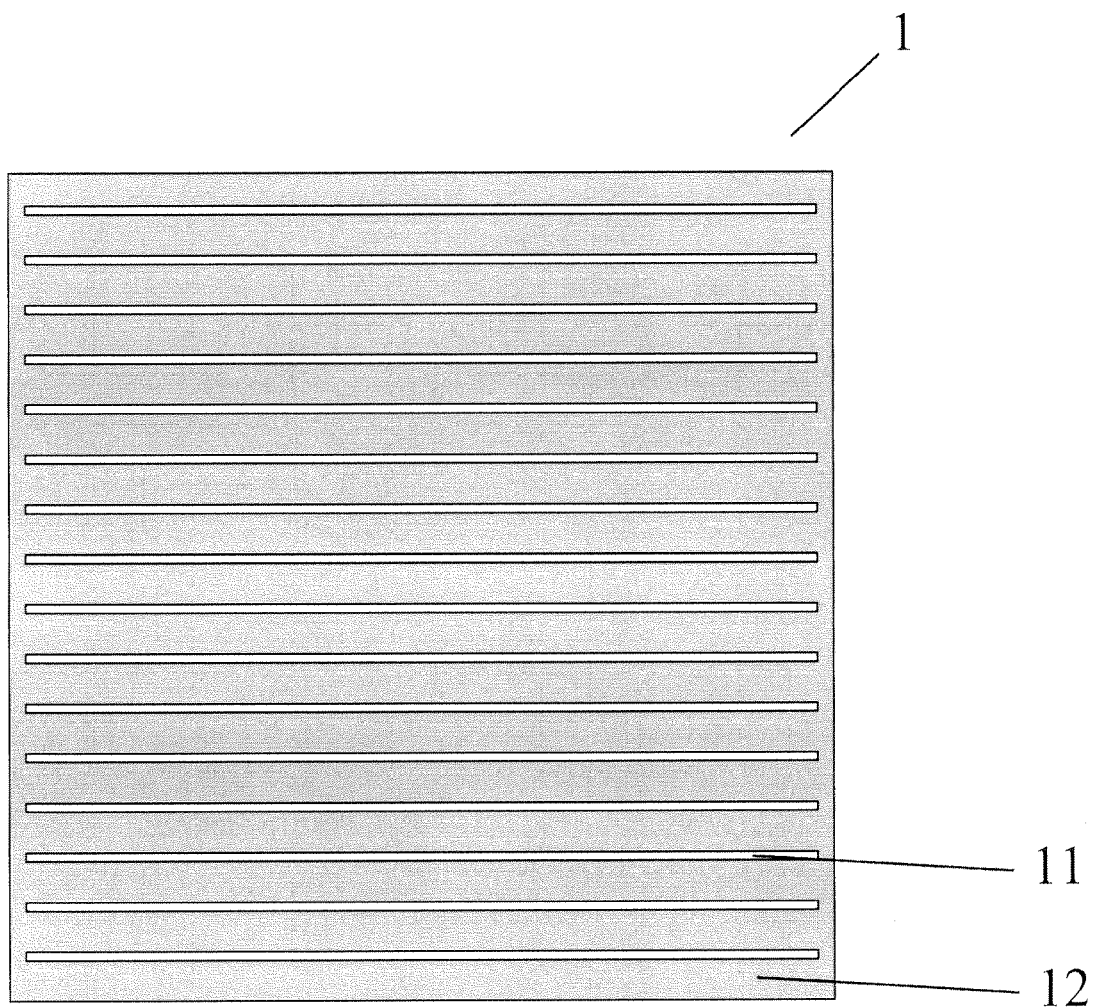
FIG. 3 is the schematic drawing of the screen of one embodiment of the method for etching a see-through thin film solar module of this invention.
Figure 4:
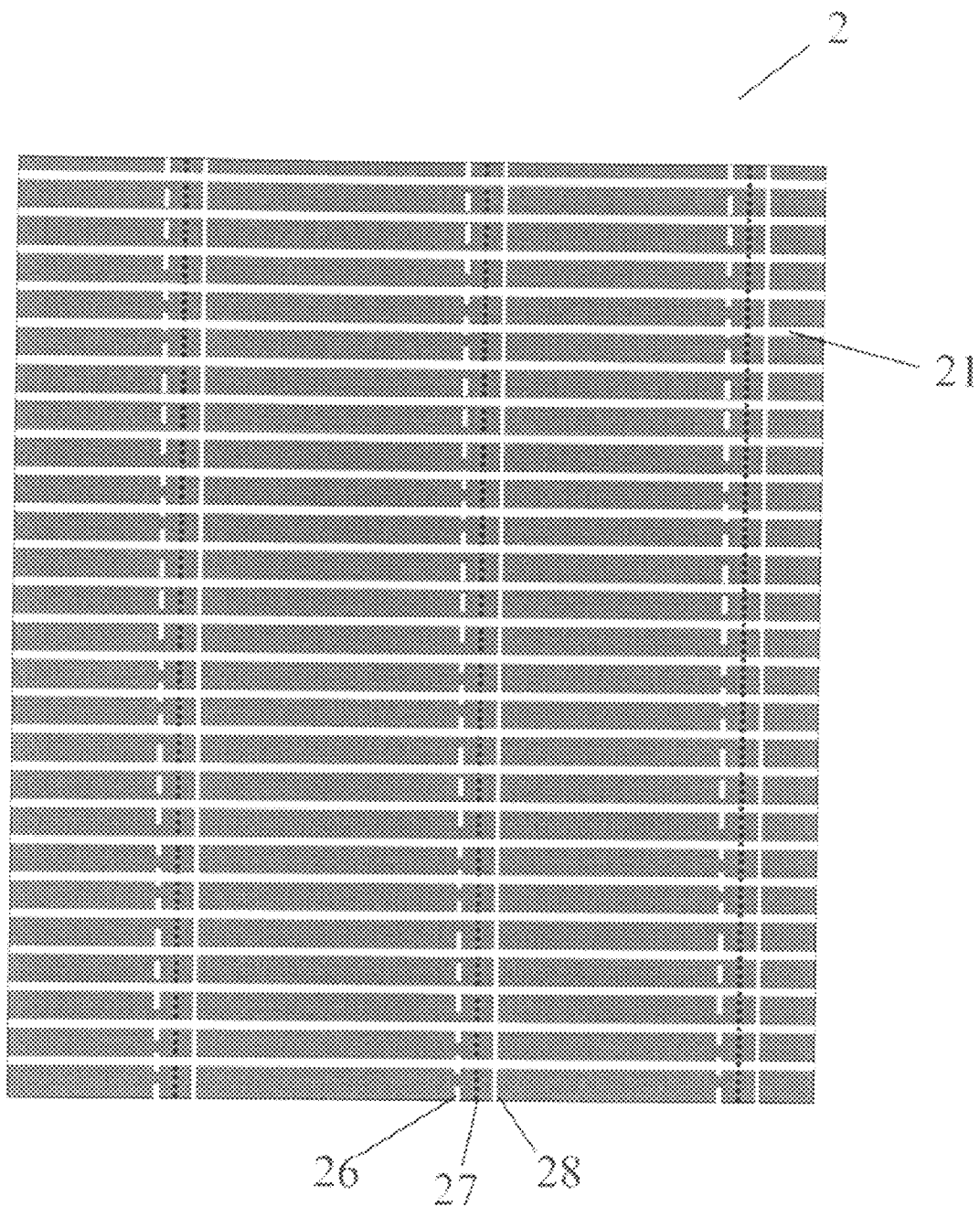
FIG. 4 is the schematic drawing of the thin film solar module using the etching method of this invention.
Figure 5:
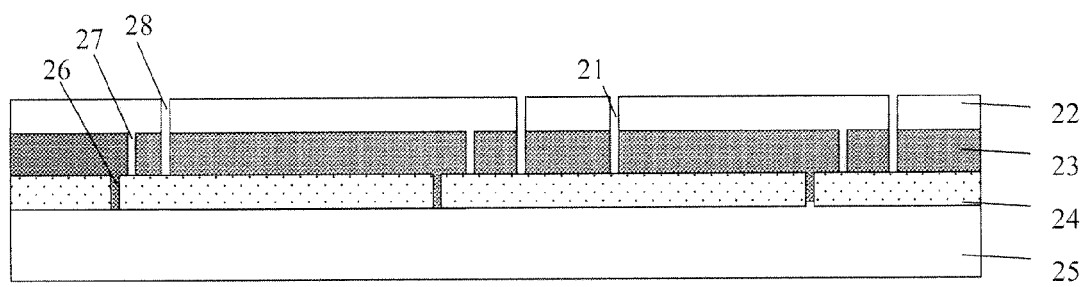
FIG. 5 is the schematic drawing of cut-away view of the thin film solar module shown in FIG. 4.

FIG. 2 is the flowchart of another embodiment of the method for etching a see-through thin film solar module of this invention. FIG. 3 is the schematic drawing of the screen of one embodiment of the method for etching a see-through thin film solar module of this invention. FIG. 4 is the schematic drawing of the thin film solar module using the etching method of this invention. FIG. 5 is the schematic drawing of cut-away view of the thin film solar module shown in FIG. 4.

The structure of the thin film solar module 2 is shown in FIG. 5, wherein 21 is a see-through area; 22, a back metal electrode layer; 23, an amorphous silicon thin film layer; 24, a transparent conductive film; 25, a glass substrate; 26, a laser-scribed groove P1; 27, a laser-scribed groove P2; and 28, a laser-scribed groove P3.

With reference to FIGS. 3-5, the method of another embodiment of this invention is specifically as below:

The thin film solar module 2 is placed under the screen 1 of the screen printer, the screen 1 being made according to the designed or client-desired pattern of the see-through area; the ink paste cannot be printed on the corresponding surface of the thin film solar module 2 via the area 11, so that the surface of the thin film solar module 2 corresponding to the area 11 cannot be protected by the ink paste and will be etched by the etching solutions in the following procedures to form the see-through area 21 of the thin film solar module 2; the ink paste can be printed on the corresponding surface of the thin film solar module 2 via the area 12, so that the surface of the thin film solar module 2 corresponding to the area 12 is protected by the ink paste and will not be etched by the etching solutions in the following procedures; after the ink paste which resists the etching of the etching solutions is printed on the protected area of the thin film solar module 2, the screen 1 is removed, and the thin film solar module 2 is placed in the annealing furnace so that the ink paste can be dried and solidified, wherein the ink paste may be a water soluable ink paste and may comprise 25%-35% of water soluable acrylic resin, 15%-25% of water, 5%-15% of ethanol, 5%-10% of triethylamine, 10%-30% of pigment and 1%-3% of additive.

Then, etching solutions are coated on the see-through thin film solar module 2 as shown in FIG. 2, comprising:

S021: coating the see-through thin film solar module with HCL solution having a concentration of 10%-30% which reacts with the metal electrode on the back of the thin film solar module to etch the metal electrode. Preferably, the see-through thin film solar module is cleaned with deionized water. In this step, the concentration of the HCL solution is preferably 15%-25%.

S022: coating the see-through thin film solar module with NaOH solution which reacts with the bared amorphous silicon film of the thin film solar module after being etched by HCL solution to etch the amorphous silicon film; wherein the NaOH solution has a concentration of 10%-30% and a temperature of 40° C.-80° C. In this step, preferably, the NaOH solution has a concentration of 15%-25% and a temperature of 50° C.-70° C.

Specifically, after the ink paste is solidified, the thin film solar module 2 is immersed in the HCL solution having a concentration of 10%-30%, or a spraying gun is used to spray the HCL solution having a concentration of 10%-30% to the part that need to be see-through such as the see-through area 21. The back metal electrode layer 22 which is not protected by the ink paste is removed due to chemical reaction with HCL. Then, the thin film solar module 2 is immersed in the NaOH solution having a concentration of 10%-30% and a temperature of 40° C.-80° C., or a spraying gun is used to spray the NaOH solution having a concentration of 10%-30% and a temperature of 40° C.-80° C. to the part that need to be see-through such as the see-through area 21. After the back metal electrode layer 22 is etched away by the HCL solution in step S021, the bared amorphous silicon film layer 23, which is not protected by the ink paste, reacts with the NaOH solution to reveal the transparent conductive film 24, thereby realizing see-through function.

Finally, the ink paste coated on the thin film solar module 2 is removed. Specifically, deionized water may be used to flush away the coated ink paste.

The method for etching a see-through thin film solar module of this embodiment is a new method for etching a see-through thin film solar module without using an adhesive tape as the mask. By combined use of a screen printer and a screen, ink paste is printed on the area of the see-through thin film solar module that does not need to be see-through, thereby accurately positioning the see-through area, achieving various selections of see-through patterns since the pattern of the screen can be pre-set, and facilitating the realization of the see-through function in large-area see-through thin film solar modules.

Figure 6:
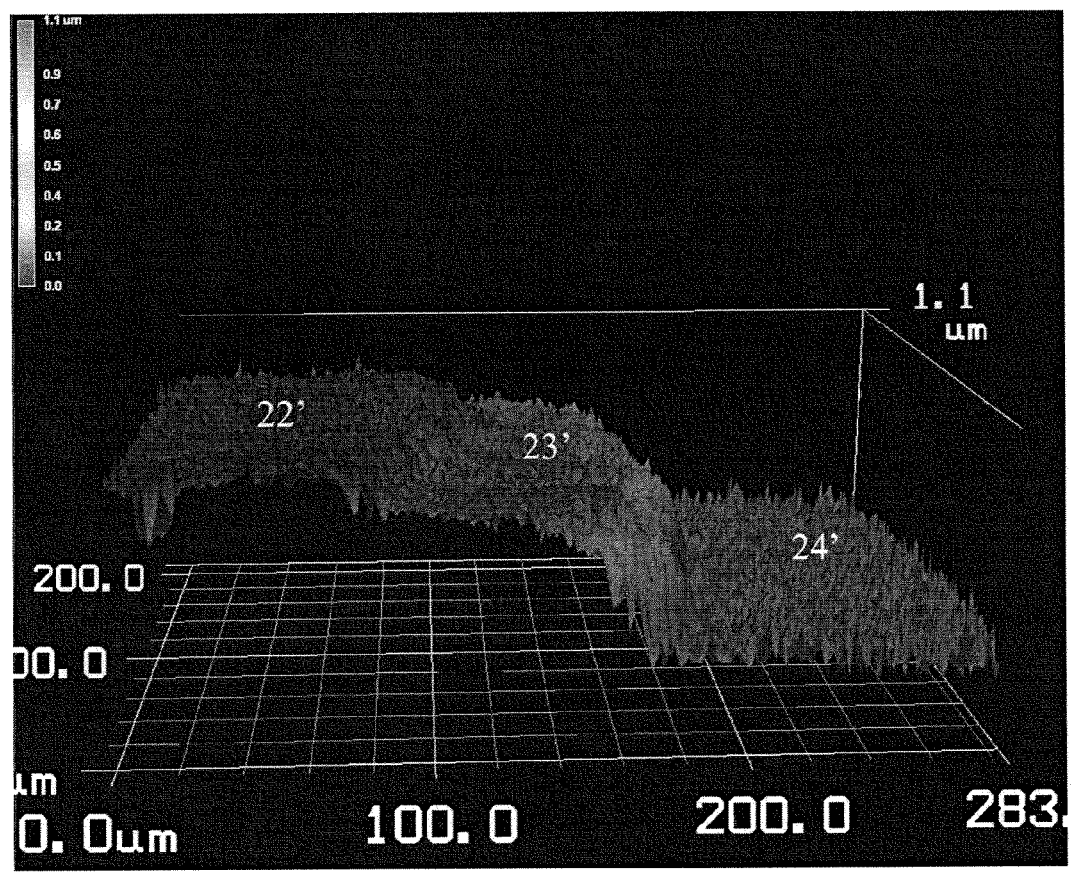
FIG. 6 is a 3-D laser scan microscopic picture of the boundaries of the etched area and the protected area by the ink paste of a see-through thin film solar module using the etching method of this invention.

FIG. 6 is a 3-D laser scan microscopic picture (amplified by 1,000 times) of the boundaries of the etched area and the protected area by the ink paste of a see-through thin film solar module using the etching method of this invention.

As shown in FIG. 6, 22' is the back metal electrode layer of the see-through thin film solar module obtained by using the method for etching a see-through thin film solar module of this invention; 23' is the amorphous silicon layer of the see-through thin film solar module obtained by using the method for etching a see-through thin film solar module of this invention; 24' is the transparent conductive film layer of the see-through thin film solar module obtained by using the method for etching a see-through thin film solar module of this invention. From FIG. 6, it can be clearly seen that the amorphous silicon layer 23' forms a "step" between the transparent conductive film layer 24' (anode) and the back metal electrode layer 22' (cathode). Thus, a short circuit between the transparent conductive film layer 24' (anode) and the back metal electrode layer 22' (cathode) can be effectively avoided, thereby solving the problem that a short circuit easily occurs in a see-through thin film solar module and improving the electrical performance of the see-through thin film solar module.

Thus, this invention provides a new method for etching a see-through thin film solar module without using an adhesive tape as the mask, the method being capable of accurately positioning the see-through area, achieving various selections of see-through patterns, facilitating the realization of the see-through function in large-area see-through thin film solar modules, solving the problem that a short circuit easily occurs in a see-through thin film solar module by improving the situation that energy is unevenly distributed when laser rays are used to form circular see-through holes, and raising the power output performance of the see-through thin film solar module.

To sum up, the above descriptions are only examples of this invention and are not intended to limit, but to explain this invention. Any modifications, parallel substitutions and improvements which fall into spirit and principle of this invention should be deemed to be within the protection scope of this invention.

The invention claimed is:

1. A method for etching a see-through thin film solar module, comprising:
   screen-printing ink paste which resists etching of etching solutions in a protected area of the thin film solar module which is placed under a screen, and drying and solidifying the ink paste;
   coating etching solutions on the thin film solar module; and
   removing the ink paste.

2. The method according to claim 1, wherein the screen is pre-set with a pattern corresponding to a light-transmission area of the thin film solar module.

3. The method according to claim 1, wherein the ink paste is a water soluable ink paste.

4. The method according to claim 3, wherein the water soluable ink paste comprises:
   25%-35% of water soluable acrylic resin, 15%-25% of water, 5%-15% of ethanol, 5%-10% of triethylamine, 10%-30% of pigment and 1%-3% of additive.

5. The method according to claim 1, wherein the removal of the ink paste is performed by flushing the ink paste with deionized water.

6. The method according to claim 1, wherein coating the etching solutions on the thin film solar module comprises:
   coating the thin film solar module with HCL solution having a concentration of 10%-30% which reacts with the metal electrode on the back of the thin film solar module to etch the metal electrode; and
   coating the thin film solar module with NaOH solution having a concentration of 10%-30% and a temperature of 40° C.-80° C. which reacts with the bared amorphous silicon film of the thin film solar module to remove the amorphous silicon film.

7. The method according to claim 6, further comprising cleaning the thin film solar module etched by the HCL solution before coating the NaOH solution.

8. The method according to claim 6, wherein the concentration of the HCL solution is 15%-25%.

9. The method according to claim 6, wherein the NaOH solution has a concentration of 15%-25% and a temperature of 50° C.-70° C.

10. The method according to claim 1, wherein coating the etching solutions on the thin film solar module refers to immersing the thin film solar module in the etching solutions or spraying the etching solutions on the thin film solar module.

* * * * *